(12) United States Patent
Hong et al.

(10) Patent No.: US 10,991,658 B2
(45) Date of Patent: Apr. 27, 2021

(54) ELECTRONIC ELEMENT MODULE AND METHOD FOR MANUFACTURING THE SAME

(71) Applicant: Samsung Electro-Mechanics Co., Ltd., Suwon-si (KR)

(72) Inventors: Suk Youn Hong, Suwon-si (KR); Han Su Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/540,351

(22) Filed: Aug. 14, 2019

(65) Prior Publication Data
US 2020/0335453 A1 Oct. 22, 2020

(30) Foreign Application Priority Data
Apr. 22, 2019 (KR) .......................... 10-2019-0046578

(51) Int. Cl.
*H01L 23/552* (2006.01)
*H01L 21/56* (2006.01)
*H01L 23/66* (2006.01)
*H01L 23/498* (2006.01)

(52) U.S. Cl.
CPC .......... *H01L 23/552* (2013.01); *H01L 21/561* (2013.01); *H01L 23/49838* (2013.01); *H01L 23/66* (2013.01); *H01L 2223/6677* (2013.01)

(58) Field of Classification Search
CPC . H01L 23/66; H01L 23/49838; H01L 23/552; H01L 21/561; H01L 2223/6677; H01L 2924/181; H01L 2924/3025; H01L 2224/16225
See application file for complete search history.

(56) References Cited

U.S. PATENT DOCUMENTS

2008/0308912 A1* 12/2008 Cha ....................... H01L 23/552
257/659
2016/0095267 A1 3/2016 Kitazaki et al.

FOREIGN PATENT DOCUMENTS

JP 5416458 B2 2/2014
JP 6387278 B2 9/2018

* cited by examiner

*Primary Examiner* — Jasmine J Clark
(74) *Attorney, Agent, or Firm* — NSIP Law

(57) ABSTRACT

An electronic element module includes: a substrate including ground wirings; at least one electronic element mounted on a first surface of the substrate; a sealing portion embedding the at least one electronic element therein and disposed on the substrate; connection conductors partially disposed on side surfaces of the substrate and having lower ends connected to the ground wirings; and a shielding portion disposed along the sealing portion, and connected to the connection conductors.

19 Claims, 5 Drawing Sheets

I-I'

ELECTRONIC ELEMENT MODULE AND METHOD FOR MANUFACTURING THE SAME

CROSS-REFERENCE TO RELATED APPLICATIONS

This application claims the benefit under 35 U.S.C. § 119(a) of Korean Patent Application No. 10-2019-0046578 filed on Apr. 22, 2019 in the Korean Intellectual Property Office, the entire disclosure of which is incorporated herein by reference for all purposes.

BACKGROUND

1. Field

The following description relates to an electronic element module. More particularly, the following description relates to an electronic element module capable of protecting passive elements or a semiconductor chip from an external environment and shielding electromagnetic waves, and a method for manufacturing the electronic element module.

2. Description of Related Art

Recently, demand for portable electronic products has rapidly increased. In order to satisfy such demand, miniaturization and lightening of the electronic elements mounted in a portable electronic product are desirable.

A system on chip (SOC) technology of implementing a plurality of individual elements on a single chip, a system in package (SIP) technology of integrating a plurality of individual elements in a single package, and the like, as well as a technology of decreasing individual sizes of mounted components are useful technologies for achieving the miniaturization and the lightening of such electronic elements.

In particular, a radio frequency electronic element module that handles a radio frequency signal, such as a communications module or a network module, is required to be miniaturized and to have various electromagnetic wave shielding structures in order to provide excellent shielding characteristics against electromagnetic interference (EMI).

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, an electronic element module includes: a substrate including ground wirings; at least one electronic element mounted on a first surface of the substrate; a sealing portion embedding the at least one electronic element therein and disposed on the substrate; connection conductors partially disposed on side surfaces of the substrate and having lower ends connected to the ground wirings; and a shielding portion disposed along the sealing portion, and connected to the connection conductors.

The shielding portion may include shielding walls disposed on side surfaces of the sealing portion and in contact with the connection conductors, and a shielding layer disposed on an upper surface of the sealing portion. The shielding walls and the shielding layer may be formed of different materials.

At least portions of the ground wirings may be exposed externally of the substrate.

Upper ends of the connection conductors may be exposed through an upper surface of the substrate and may be in contact with the sealing portion.

The shielding walls may be disposed such that at least portions of the shielding walls are in contact with insulating layers of the substrate.

The substrate may further include wiring layers disposed in a stacked configuration. The shielding walls may be connected to the ground wirings on different wiring layers among the wiring layers.

The substrate may have a rectangular shape, and the connection conductors may be formed on an entirety of at least one side surface among the side surfaces of the substrate.

The ground wirings may be spaced apart from a lower surface of the substrate, and an antenna may be disposed between the ground wirings and the lower surface of the substrate.

The shielding portion may include a first shielding wall disposed on a first side surface of the sealing portion and in contact with a first connection conductor among the connection conductors, a second shielding wall disposed on a second side surface of the sealing portion and in contact with a second connection conductor among the connection conductors, and a shielding layer disposed on an upper surface of the sealing portion.

The substrate may further include a first wiring layer and a second wiring layer stacked on the first wiring layer. The first shielding wall may be connected to a first ground wiring, among the ground wirings, disposed on the first wiring layer. The second shielding wall may be connected to a second ground wiring, among the ground wirings, disposed on the second wiring layer.

In another general aspect, a method for manufacturing an electronic element module includes: preparing a substrate divided into mounting regions by grooves in which a conductive material is disposed; mounting at least one electronic element in each of the mounting regions; forming a sealing portion embedding the at least one electronic element therein on the substrate; forming trenches by partially removing the sealing portion such that the conductive material in the grooves is exposed; filling a conductive member in the trenches; forming a shielding layer on an upper surface of the sealing portion; and cutting the substrate along the grooves.

The grooves may have bottom surfaces on which ground wirings are disposed, and side surfaces on which connection conductors are disposed.

The grooves may be disposed in an entirety of boundaries of the mounting regions.

The ground wirings may be spaced apart from a lower surface of the substrate, and an antenna may be disposed between the ground wirings and the lower surface of the substrate.

The forming of the sealing portion on the substrate may include filling the sealing portion in the grooves.

The partially removing of the sealing portion may include partially removing the sealing portion using a laser.

The conductive member may be a conductive paste comprising a conductive filler disposed in a resin.

The cutting of the substrate along the grooves may include cutting the conductive member and the substrate such that the conductive member is disposed on side surfaces of the sealing portion and side surfaces of the substrate.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
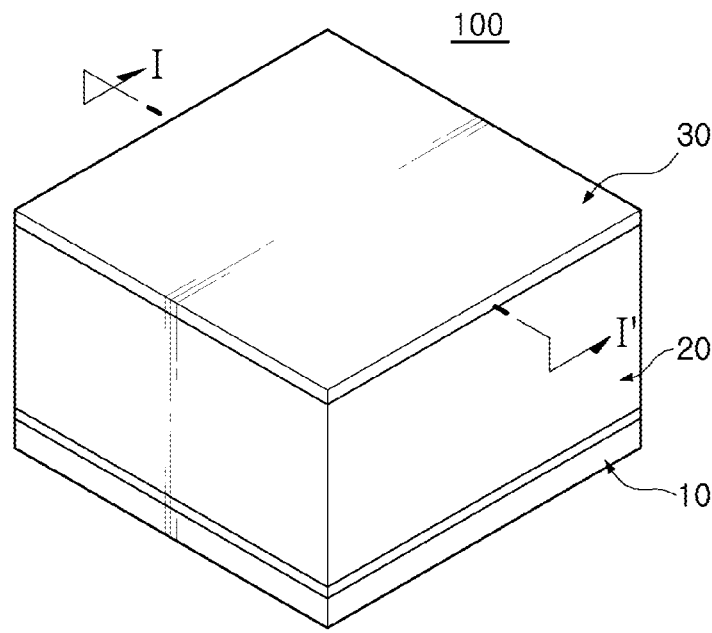
FIG. 1 is a perspective view illustrating an electronic element module, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
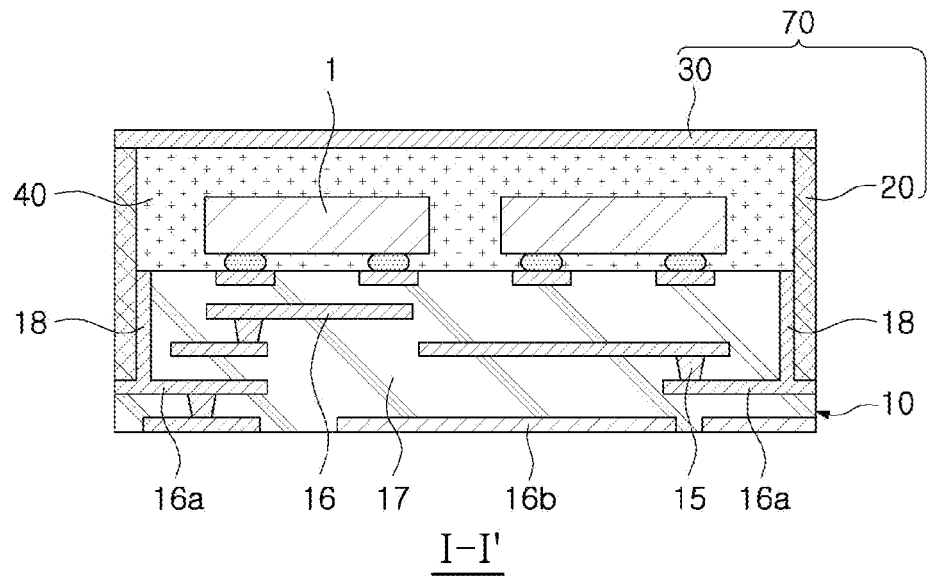
FIG. 2 is a cross-sectional view taken along line I-I' of FIG. 1.

FIG. 1 is a perspective view illustrating an electronic element module 100, according to an embodiment. FIG. 2 is a cross-sectional view taken along line I-I' of FIG. 1.

Referring to FIGS. 1 and 2, the electronic element module 100 may include a substrate 10, electronic elements 1, a sealing portion 40, and a shielding portion 70.

The substrate 10 may be a multilayer substrate formed by repeatedly stacking insulating layers 17 and wiring layers 16. However, if necessary, the substrate 10 may be a double-sided substrate having wiring layers 16 formed on opposite sides of one insulating layer 17. For example, various kinds of substrates (e.g., a printed circuit board, a flexible substrate, a ceramic substrate, a glass substrate, and the like) that are well known in the art may be used as the substrate 10.

The insulating layer 17 is not limited to a particular material. For example, an insulating material of the insulating layer 17 may be a thermosetting resin such as an epoxy resin, a thermoplastic resin such as polyimide, a resin in which the thermosetting resin and the thermoplastic resin are impregnated together with inorganic filler in a core material such as a glass fiber (or a glass cloth or a glass fabric), for example, prepreg, Ajinomoto Build-up Film (ABF), FR-4, Bismaleimide Triazine (BT), or the like.

The wiring layer 16 may be electrically connected to the electronic element 1. In addition, the wiring layer 16 may be electrically connected to the shielding portion 70.

The wiring layer 16 may be formed of a conductive material such as copper (Cu), aluminum (Al), silver (Ag), tin (Sn), gold (Au), nickel (Ni), lead (Pb), titanium (Ti), or alloys thereof.

Interlayer connection conductors 15 may be disposed in the insulating layer 17 to interconnect the wiring layers 16 in a stacked configuration.

In addition, an insulating protective layer may be disposed on a surface of the substrate 10. The insulating protective layer may be formed of a solder resist, and may be disposed to cover all of the insulating layers 17 and the wiring layers 16 on upper and lower surfaces of the insulating layers 17. Therefore, the insulating protective layer may protect the wiring layers 16 disposed on the upper or lower surface of the insulating layer 17.

The substrate 10 may include a first surface and a second surface opposing the first surface. The first surface of the substrate 10 is, for example, a surface on which the electronic elements 1 are mounted, and the second surface of the substrate 10 is, for example, a surface opposing a main substrate when the electronic element module 100 is mounted on the main substrate. According to an example, the first surface of the substrate 10 is an upper surface of the substrate 10 and the second surface of the substrate 10 is a lower surface of the substrate 10, or vice-versa.

Mounting electrodes for mounting the electronic elements 1 may be disposed on the first surface of the substrate 10. In addition, connection electrodes for connecting connection terminals such as solder balls may be disposed on the second surface of the substrate 10. At least one of the mounting electrodes may be used as a ground electrode.

On the other hand, in the disclosed embodiment, the wiring layers 16 may include ground wirings 16a. The ground wirings 16a may be positioned in the substrate 10 and may be electrically connected to the ground electrode.

At least portions of the ground wirings 16a may be exposed externally of the substrate 10 through side surfaces of the substrate 10. Such a configuration may be clearly understood through a method for manufacturing an electronic element module according to the present exemplary embodiment described later.

The connection conductors 18 may be disposed on the ground wirings 16a. For example, the connection conductors 18 may be formed on at least one ground wiring 16a and may be partially disposed on side walls formed by the insulating layers 17. Therefore, an upper surface of the connection conductor 18 may be exposed through the upper (first) surface of the substrate 10 and in contact with the sealing portion 40, and a lower end of the connection conductor 18 may be disposed on an upper surface of the ground wiring 16a and connected to the ground wiring 16a.

In addition, in the disclosed embodiment, the ground wirings 16a may be disposed to externally (laterally) protrude from the connection conductors 18. Therefore, the connection conductors 18 may extend to the first surface of the substrate 10 along a direction orthogonal to the ground wirings 16a inside the ground wirings 16a.

The connection conductor 18 may be formed of the same material as that of the wiring layer 16. However, the material of the connection conductor 18 is not limited to being the same as the material of the wiring layer 16, and various materials may be used for the connection conductor 18, as long as the connection conductors 18 may electrically connect the shielding portion 70 and the ground wirings 16a to each other.

In the illustrated embodiment, the substrate 10 is formed in a rectangular shape and the connection conductors 18 are continuously formed on all four side surfaces of the substrate 10. However, the disclosure is not limited to this configuration, and the connection conductors 18 may be formed on at least one side surface among the four side surfaces of the substrate 10. In addition, the connection conductors 18 may be formed on the entirety of the at least one side surface, or may be formed only on a portion of the at least one side surface.

The electronic elements 1 may be mounted on one surface (e.g., the first, or upper, surface) of the substrate 10. The electronic elements 1 may include various elements such as active elements and passive elements, and any elements or components that may be mounted on the substrate 10 may be used as the electronic element 1.

In addition, the electronic elements 1 may include elements that emit electromagnetic waves during operation or need to be protected from electromagnetic waves introduced from an external source.

The sealing portion 40 may be disposed on the first surface of the substrate 10 to seal the electronic elements 1. The sealing portion 40 may safely protect the electronic elements 1 from external impact by fixing the electronic elements 1 in an externally enclosed form.

The sealing portion 40 may be formed of an insulating material. For example, the sealing portion 40 may be formed of a resin material such as epoxy molding compound (EMC), but is not limited thereto. In addition, if necessary, the sealing portion 40 may also be formed of a material having conductivity (e.g., a conductive resin or the like). In this case, a separate sealing member such as an underfill resin may be provided between the electronic element 1 and the substrate 10.

Shielding walls 20 may be formed along side surfaces of the sealing portion 40 to shield electromagnetic waves introduced to the electronic elements 1 from an external source, or to externally shield electromagnetic waves emitted from the electronic elements 1. Therefore, the shielding walls 20 may be formed of a conductive material, and may be electrically and physically connected to the ground wirings 16a and the connection conductors 18.

Upper ends of the shielding walls 20 may be disposed on the same plane on which the upper surface of the sealing portion 40 is disposed. In addition, lower ends of the shielding walls 20 may be bonded to the ground wirings 16a of the substrate. Since the ground wirings 16a are included in the wiring layers 16 positioned in the substrate 10, a height of the shielding wall 20 may be higher than that of the sealing portion 40.

The shielding walls 20 may be formed using conductive paste. For example, the shielding walls 20 may be formed by curing a conductive resin containing conductive filler in a resin such as an epoxy. However, the shielding walls 20 are not limited to being formed according to this example.

A shielding layer 30 may be formed along an upper surface of the sealing portion 40 to shield electromagnetic waves introduced to the electronic elements 1 from an external source, or to externally shield electromagnetic waves emitted from the electronic elements 1. Therefore, the shielding layer 30 may be formed of a conductive material, and may be electrically connected to the ground wirings 16a of the substrate 10 through the shielding walls 20.

The shielding layer 30 may be provided by applying a resin material containing conductive powder to an outer surface of the sealing portion 40 or by forming a metal thin film on the outer surface of the sealing portion 40. Various technologies such as a sputtering method, a screen printing method, a vapor deposition method, an electroplating method, and an electroless plating method may be used to form the metal thin film.

For example, the shielding layer 30 may be a metal thin film formed on the outer surface of the sealing portion 40 by a spray coating method. The spray coating method may have advantages in that a uniform coating film may be formed and a cost required for equipment investment is smaller as compared to other processes. However, the method for forming the metal thin film is not limited to a spray coating method, and the metal thin film may also be formed through a sputtering method.

The shielding layer 30 may be disposed on the upper surfaces of the shielding walls 20 and may be electrically connected to the shielding walls 20.

In the disclosed embodiment, the shielding layer 30 and the shielding walls 20 may be formed through separate manufacturing processes. Therefore, the shielding layer 30 and the shielding walls 20 may be formed of different materials. However, if necessary, the shielding layer 30 and the shielding walls 20 may also be formed of the same material.

The electronic element module 100 may protect the electronic elements 1 from an external environment due to the configuration of the sealing portion 40 or the shielding layer 30, and may easily shield electromagnetic waves.

In addition, since the shielding walls 20 are bonded to all of the ground wirings 16a and the connection conductors 18, bonding reliability between the shielding walls 20 and the ground wirings 16a may be increased.

The electronic element module 100 may include an antenna formed in the substrate 10 or on one surface (e.g., the second, or lower, surface) of the substrate 10. In the disclosed embodiment, the ground wirings 16a may be spaced apart from the lower surface of the substrate 10, and the antenna 16b may include at least some regions of the wiring layers 16 positioned between the ground wirings 16a and the lower surface of the substrate 10.

Therefore, in a case in which the shielding walls 20 are disposed to cover the entirety of the side surfaces of the substrate 10, a transmitting and receiving function of the antenna 16b may be degraded or characteristics of the antenna 16b may be distorted by the shielding wall 20.

As a result, the shielding walls 20 may be disposed only on some regions of the side surfaces of the substrate 10, not on the entirety of the side surfaces of the substrate 10. More specifically, the shielding walls 20 may be disposed only on upper regions of the ground wirings 16a of the side surfaces of the substrate 10 and may not be disposed on lower regions of the ground wirings 16a.

Therefore, the antenna 16b may include at least some regions of the wiring layers 16 disposed on the lower regions of the ground wirings 16a.

FIGS. 3 through 8 are views illustrating processes of a method for manufacturing the electronic element module 100, according to an embodiment.

Figure 3:
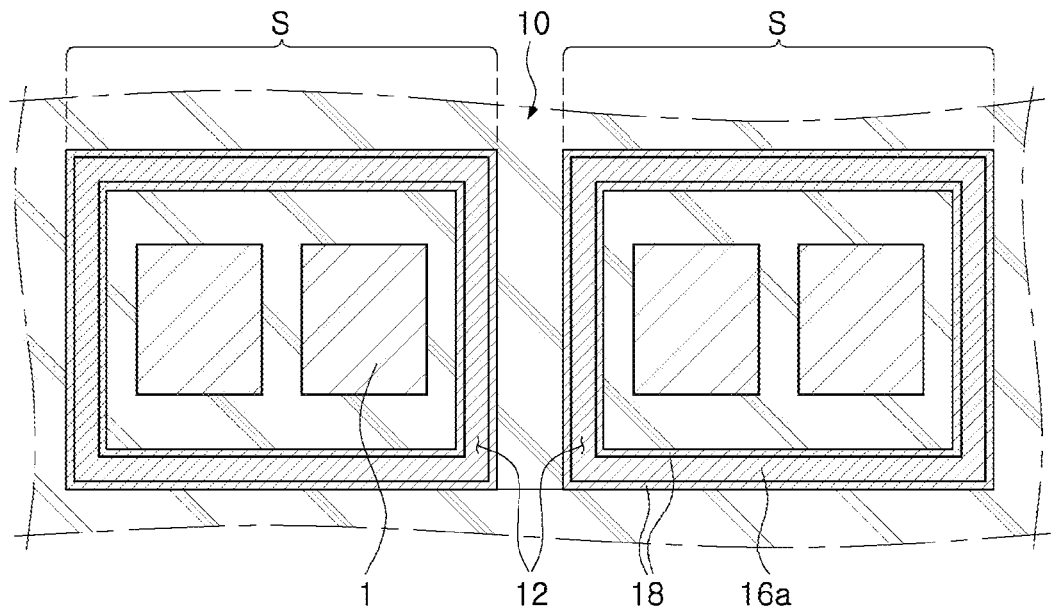
FIGS. 3 through 8 are views illustrating processes of a method for manufacturing an electronic element module, according to an embodiment.

In the method for manufacturing the electronic element module 100, first, as illustrated in FIG. 3, the electronic elements 1 may be mounted on the first surface of the substrate 10.

Figure 4:
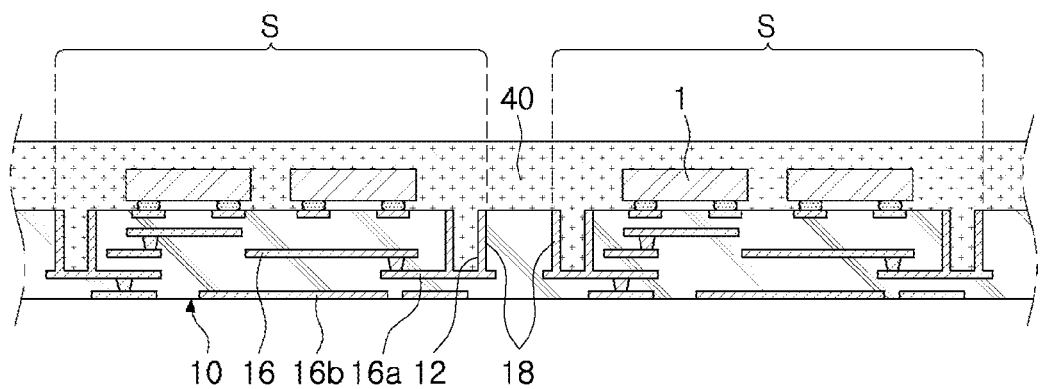

The substrate 10, which is a multilayer circuit substrate including a plurality of layers, may include the wiring layers 16 electrically connected to each other as illustrated in FIG. 4, and at least some of the wiring layers 16 may be used as the ground wirings 16a.

A substrate (hereinafter, referred to as a strip substrate) having a panel form or a strip form may be used as the substrate 10. The purpose of the strip substrate 10 may be to simultaneously manufacture a plurality of electronic element modules 100. Thus, individual package regions S may be divided on the strip substrate 10, and the plurality of electronic element modules 100 may be simultaneously manufactured for each of the individual package regions S.

In addition, grooves 12 in which the ground wirings 16a and the connection conductors 18 are disposed may be provided in the first surface of the substrate 10.

The ground wirings 16a of the substrate 10 may be disposed on bottom surfaces of the grooves 12. In addition, the connection conductors 18 may be disposed on both side surfaces of the grooves 12, opposing each other. Therefore, a conductive material may be disposed on the entirety of inner surfaces of the grooves 12. Such a configuration may be formed by partially removing the insulating layers 17 so that the ground wirings 16a are exposed through the first surface of the substrate 10. For example, the configuration may be formed by using a laser to form the grooves 12 in the substrate 10, and then applying the conductive material onto side walls of the grooves 12. However, the disclosure is not limited to such a process.

In the disclosed embodiment, the groove 12 may be disposed in the entirety of a boundary of the individual package region S and may be formed as one continuous space. However, the groove 12 is not limited to such a configuration, and a plurality of grooves may also be disposed in a line in a discontinuous form, if necessary. In addition, the groove 12 may also be disposed only in a portion of the boundary of the individual package region S.

The electronic elements 1 may be bonded to the substrate 10 through a conductive adhesive such as a solder.

Next, as illustrated in FIG. 4, the sealing portion 40 sealing the electronic elements 1 and formed on the first surface of the substrate 10 may be formed.

The sealing portion 40 may be formed on the entirety of the first surface of the substrate 10. Therefore, the sealing portion 40 may be formed to entirely embed the electronic elements 1.

During such a process, the sealing portion 40 may be filled in the grooves 12 of the substrate 10.

In the present operation, the sealing portion 40 may be formed by molding an insulating material such as epoxy molding compound (EMC) through a transfer molding process, but is not limited to being formed by such a process.

In an example in which the substrate 10 is a strip substrate, the sealing portion 40 may be formed in an integrated shape to entirely cover the individual package regions S of the strip substrate 10. However, the sealing portion 40 may also be formed to be divided for each of the individual package regions S, if necessary.

Figure 5:
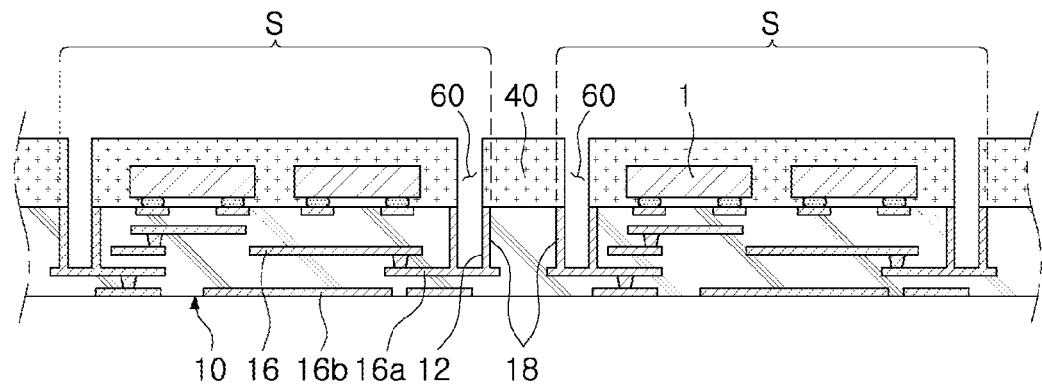

Next, as illustrated in FIG. 5, trenches 60 may be formed by partially removing the sealing portion 40.

The trenches 60 may be formed by removing the sealing portion 40 at positions corresponding to the positions at which the grooves 12 of the substrate 10 are disposed. Accordingly, the ground wirings 16a forming the bottoms of the grooves 12 may be exposed externally through the trenches 60.

The trenches 60 may be formed by removing the sealing portion 40 using a laser. In this case, since the ground wirings 16a forming the bottoms of the grooves 12 or the connection conductors 18 applied to the side walls of the grooves 12 are not easily removed by the laser, only the sealing portion 40 may be removed and the substrate 10 may not be removed in this operation.

Figure 6:
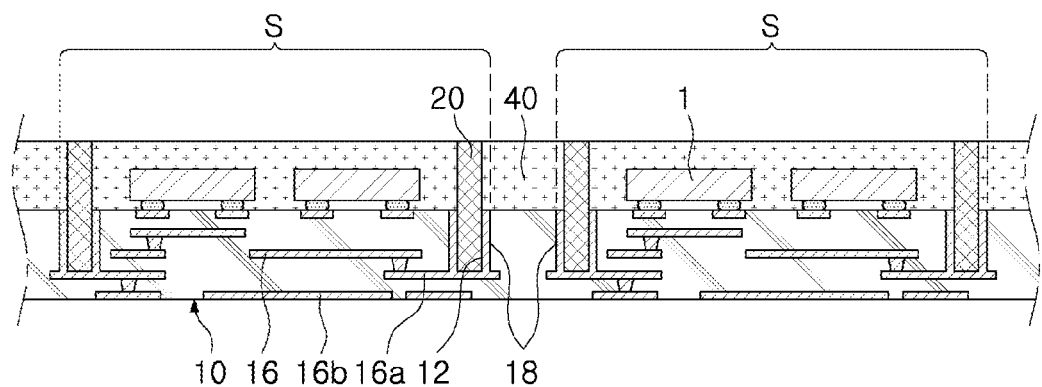

Next, as illustrated in FIG. 6, the shielding walls 20 may be formed by filling a conductive material in the trenches 60. A conductive paste including conductive filler disposed in a resin may be used as the conductive material. The conductive filler may be a metal particle such as gold (Au), silver (Ag), copper (Cu), or nickel (Ni). However, the conductive filler is not limited to the provided examples.

When the shielding walls 20 are formed, a process of flattening the upper surface of the sealing portion 40 may be performed, if necessary.

Figure 7:
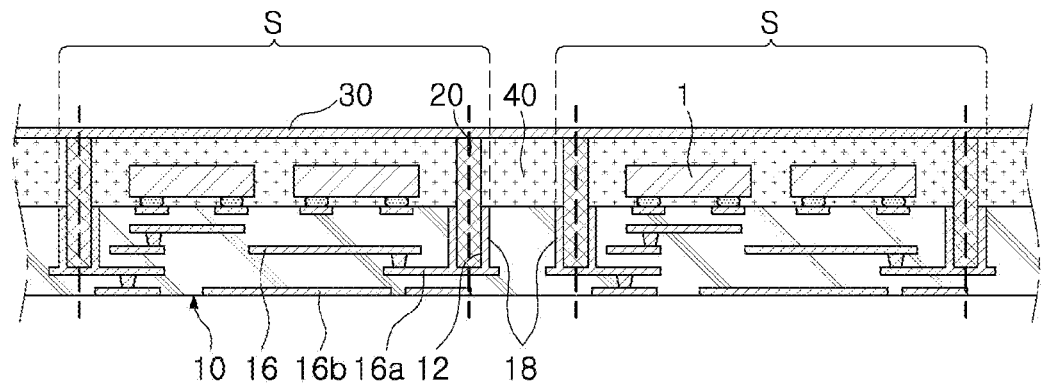

Next, as illustrated in FIG. 7, the shielding layer 30 may be formed along surfaces formed by the sealing portion 40 and the shielding walls 20.

The shielding layer 30 may be formed by applying a resin material containing conductive filler to an outer surface of the sealing portion 40 or by forming a metal thin film on the outer surface of the sealing portion 40. Various technologies such as a sputtering method, a spray coating method, a screen printing method, a vapor deposition method, an electroplating method, and an electroless plating method may be used to form the metal thin film. In such a process, the shielding layer 30 may be disposed on the surfaces of the shielding walls 20 exposed externally of the sealing portion 40 and may be electrically connected to the shielding walls 20.

In the disclosed embodiment, the shielding layer 30 and the shielding walls 20 may be formed of different conductive materials. However, the shielding layer 30 and the shielding walls 20 may also be formed of the same material (e.g., Cu, Ag, Au, Ni, Pt, Pd, or alloys thereof), if necessary.

Figure 8:
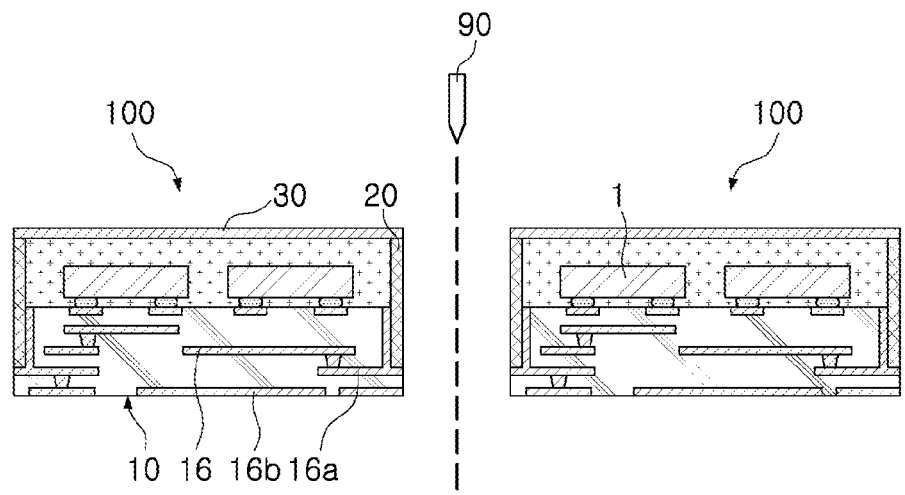

Next, as illustrated in FIG. 8, the electronic element module 100 may be completed by cutting the substrate 10 and the shielding walls 20 along the grooves 12 or the trenches 60. The cutting process may be performed using a blade 90. The blade 90 may cut the shielding walls 20 and the strip substrate 10 along the grooves 12 of the substrate 10 disposed along boundaries of the individual package regions S.

The blade 90 may cut the conductive members and the substrate 10 so that the conductive members filled in the trenches 60 are disposed on a side surface of the sealing portion 40 and a side surface of the substrate 10. As a result, the electronic element module 100, in which the shielding walls 20 partially cover the side surfaces of the substrate 10, may be manufactured.

In the example manufacturing method described above, the electronic element module may be manufactured using the substrate 10 including the grooves 12 in which the conductive material is disposed on the inner walls. However, in a case in which a substrate does not include the grooves 12, in order to expose the ground wirings 16a positioned in the substrate, the insulating layer 17 of the substrate needs to be removed during laser processing. However, in such laser processing, a glass fiber or the like contained in the insulating layer 17 is not completely removed and remains as a residue, and processing defects tend to occur.

However, in the disclosed manufacturing method, since the grooves 12 are formed in the substrate 10 in advance, the insulating layer 17 of the substrate 10 may not be removed during a laser processing. As a result, since residue of a glass fiber or the like contained in the insulating layer 17 does not remain in the trenches 12, processing defects may be prevented.

In addition, since the connection conductors 18 are disposed on the ground wirings 16a, an occurrence of burrs between the ground wirings 16a and the insulating layer 17 in the cutting process may be significantly reduced.

An electronic element module according to this disclosure is not limited to the embodiment described above, but may have various forms, and may be formed by various processes.

Figure 9:
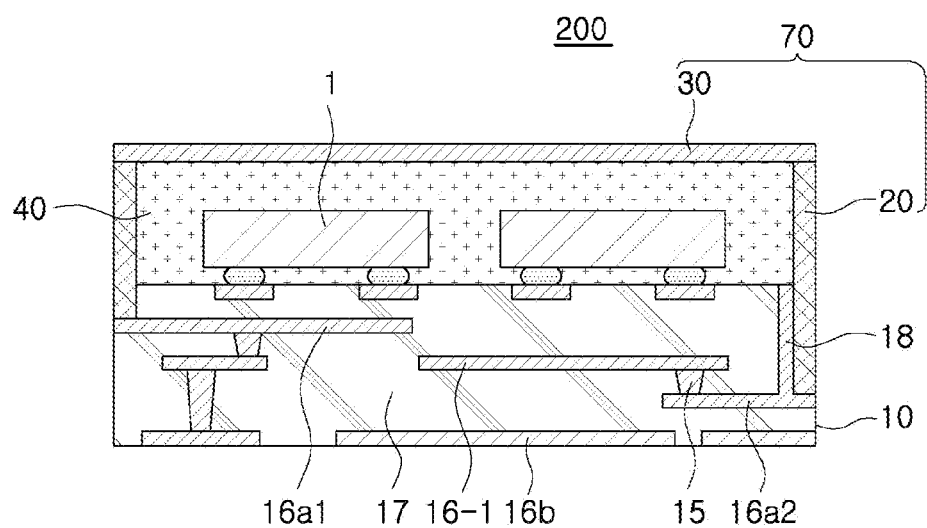
FIG. 9 is a cross-sectional view schematically illustrating an electronic element module, according to an embodiment.

FIG. 9 is a cross-sectional view schematically illustrating an electronic element module 200, according to an embodiment.

Referring to FIG. 9, the electronic element module 200 may be configured similarly to the electronic element module 100 of FIGS. 1 and 2, but, in contrast to the electronic element module 100, the electronic element module 200 includes ground wirings 16-1 including a first ground wiring 16a1 that is not connected to the connection conductor 18 and a second ground wiring 16a2 that is connected to the connection conductor 18.

Since the second ground wiring 16a2 is configured in the same manner as the ground wiring (16a in FIG. 2) of the electronic element module described above, a detailed description of the second ground wiring 16a2 is omitted.

The first ground wiring 16a1 may be formed as a portion of the wiring layers 16-1 disposed to be adjacent to the first surface of the substrate 10 among the wiring layers 16-1 of the substrate 10. Since the connection conductor 18 is not disposed on the first ground wiring 16a1, a portion of the shielding wall 20 connected to the first ground wiring 16a1 may be in contact with the insulating layer 17 of the substrate 10.

As described above, the connection conductor 18 may be provided to prevent residue from being left while the insulating layer 17 of the substrate 10 is removed in the process of forming the trenches to expose the ground wiring. However, in an example in which the connection conductor 18 is disposed adjacent to the first surface of the substrate 10 like the first ground wiring 16a1, since only a small amount of insulating layer 17 is removed, almost no residue may be left. Therefore, in this case, even in a case in which the connection conductor 18 is not provided, the above-mentioned problem does not occur.

As such, the connection conductor 18 may be omitted according to a position of the ground wiring 16a1, that is, a distance from the first surface of the substrate 10.

By such a configuration, in the electronic element module 200, the shielding walls 20 may be connected to the ground wirings 16a1 and 16a2 disposed on different wiring layers 16-1 according to the position of the shielding walls 20.

When the electronic element module 200 is configured as described above, the grooves (12 in FIG. 3) provided in the substrate 10 may be provided only in some sections, not in the entirety of the boundaries of the individual mounting regions S.

For example, although the shielding walls 20 and the shielding layer 30 are sequentially formed, the shielding layer 30 may also be formed of the same material as that of the shielding walls 20 in the process of forming the shielding walls 20.

In addition, in the above-described manufacturing method, an example in which one trench 60 is manufactured as one connection conductor is illustrated as an example, but the manufacturing method is not limited to such an example. Various modifications are possible. For example, the conductive material filled in the trench 60 may be divided into the shielding walls of two individual electronic element modules by cutting one trench 60 to be divided into two parts in the cutting process.

Further, the embodiments described above may be combined with each other.

As set forth above, according to embodiments disclosed herein, the electronic element module may protect the electronic elements mounted on the substrate from the external environment, and may easily shield electromagnetic waves due to the configuration of the sealing portion and the shielding portion.

In addition, since the shielding portion is bonded to both the ground wiring and the connection conductor, bonding reliability between the shielding portion and the ground wiring may be increased and the occurrence of the burrs in the ground wiring during the manufacturing process may be significantly reduced.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic element module, comprising:
   a substrate comprising ground wirings;
   at least one electronic element mounted on a first surface of the substrate;
   a sealing portion embedding the at least one electronic element therein and disposed on the substrate;
   connection conductors partially disposed on side surfaces of the substrate and having lower ends connected to the ground wirings; and
   a shielding portion disposed along the sealing portion, and connected to the connection conductors,
   wherein the connection conductors are disposed between insulating layers of the substrate and the shielding portion.

2. The electronic element module of claim 1, wherein the shielding portion comprises shielding walls disposed on side surfaces of the sealing portion and in contact with the connection conductors, and a shielding layer disposed on an upper surface of the sealing portion, and
   wherein the shielding walls and the shielding layer are formed of different materials.

3. The electronic element module of claim 2, wherein at least portions of the ground wirings are exposed externally to the substrate.

4. The electronic element module of claim 3, wherein upper ends of the connection conductors are exposed through an upper surface of the substrate and are in contact with the sealing portion.

5. The electronic element module of claim 2, wherein the shielding walls are disposed such that at least portions of the shielding walls are in contact with the insulating layers of the substrate.

6. The electronic element module of claim 2, wherein the substrate further comprises wiring layers disposed in a stacked configuration, and
   wherein the shielding walls are connected to the ground wirings on different wiring layers among the wiring layers.

7. The electronic element module of claim 1, wherein the substrate has a rectangular shape, and the connection conductors are formed on an entirety of at least one side surface among the side surfaces of the substrate.

8. The electronic element module of claim 1, wherein the ground wirings are spaced apart from a lower surface of the substrate, and
   wherein an antenna is disposed between the ground wirings and the lower surface of the substrate.

9. The electronic element module of claim 1, wherein the shielding portion comprises:
   a first shielding wall disposed on a first side surface of the sealing portion and in contact with a first connection conductor among the connection conductors,
   a second shielding wall disposed on a second side surface of the sealing portion and in contact with a second connection conductor among the connection conductors, and
   a shielding layer disposed on an upper surface of the sealing portion.

10. The electronic element module of claim 9, wherein the substrate further comprises a first wiring layer and a second wiring layer stacked on the first wiring layer,
    wherein the first shielding wall is connected to a first ground wiring, among the ground wirings, disposed on the first wiring layer, and
    wherein the second shielding wall is connected to a second ground wiring, among the ground wirings, disposed on the second wiring layer.

11. The electronic element module of claim 1, wherein an upper surface of the connection conductors is exposed through an upper surface of the substrate.

12. A method for manufacturing an electronic element module, the method comprising:
    preparing a substrate divided into mounting regions by grooves in which a conductive material is disposed;
    mounting at least one electronic element in each of the mounting regions;
    forming a sealing portion embedding the at least one electronic element therein on the substrate;
    forming trenches by partially removing the sealing portion;
    filling the trenches with the conductive material;
    forming a shielding layer on an upper surface of the sealing portion; and
    cutting the substrate along the grooves;
    wherein the partial removal of the sealing portion exposes the conductive material in the grooves.

13. The method of claim 12, wherein the grooves comprise bottom surfaces on which ground wirings are disposed, and side surfaces on which connection conductors are disposed.

14. The method of claim 13, wherein the grooves are entirely disposed within boundaries of the mounting regions.

15. The method of claim 13, wherein the ground wirings are spaced apart from a lower surface of the substrate, and wherein an antenna is disposed between the ground wirings and the lower surface of the substrate.

16. The method of claim 12, wherein the forming of the sealing portion on the substrate comprises filling the sealing portion in the grooves.

17. The method of claim 12, wherein the partially removing of the sealing portion comprises partially removing the sealing portion using a laser.

18. The method of claim 12, wherein the conductive material is a conductive paste comprising a conductive filler disposed in a resin.

19. The method of claim 12, wherein the cutting of the substrate along the grooves comprises cutting the conductive material and the substrate such that the conductive material is disposed on side surfaces of the sealing portion and side surfaces of the substrate.

\* \* \* \* \*